United States Patent
Feng et al.

(10) Patent No.: US 8,039,955 B2
(45) Date of Patent: Oct. 18, 2011

(54) MOLD LOCK ON HEAT SPREADER

(75) Inventors: Chien-Te Feng, Shindian (TW); Frank Yu, Chung Ho (TW)

(73) Assignee: Texas Instruments Incorporated, Dallas, TX (US)

( * ) Notice: Subject to any disclaimer, the term of this patent is extended or adjusted under 35 U.S.C. 154(b) by 192 days.

(21) Appl. No.: 12/463,729

(22) Filed: May 11, 2009

(65) Prior Publication Data

US 2010/0283142 A1    Nov. 11, 2010

(51) Int. Cl.
*H01L 23/48* (2006.01)
(52) U.S. Cl. .................. 257/734; 257/E23.08; 438/122
(58) Field of Classification Search .................. 438/122; 257/E23.08, 734
See application file for complete search history.

(56) References Cited

U.S. PATENT DOCUMENTS 5,278,446 A * 1/1994 Nagaraj et al. ................ 257/707
5,990,554 A * 11/1999 Golubic et al. ............... 257/734

* cited by examiner

*Primary Examiner* — Matthew Reames
(74) *Attorney, Agent, or Firm* — Yingsheng Tung; Wade J. Brady, III; Frederick J. Telecky, Jr.

(57) ABSTRACT

A mold lock and a method of forming the mold lock are provided. The mold lock is used in an encapsulated semiconductor device and includes a neck and a shaped head integral with the neck. The mold lock can be formed to project above a support component, such as a heat spreader, of the semiconductor device and the neck is formed from the support component. The shaped head is of a greater dimension than the neck and can present a "T" shape in side view or a "Y" shape in side view. A base portion of the neck is seated within the support component. A method is provided for forming the described mold lock.

20 Claims, 5 Drawing Sheets

MOLD LOCK ON HEAT SPREADER

FIELD

This invention relates generally to a mold lock and more particularly a mold lock for securing a mold compound in a semiconductor device. The mold lock can prevent delamination between a mold compound and heat spreader of the semiconductor device.

BACKGROUND

It is well known to encapsulate integrated circuit (IC) devices in packages in order to protect the device and to provide connective leads for coupling terminals of the IC device to, for example, a printed circuit (PC) board.

The packaged IC devices commonly include a support surface, a singulated die attached to the support surface with a die adhesive, conductive leads attached to the die, and an encapsulant surrounding at least the die and portions of the conductive leads. The encapsulant functions to prevent ingress of moisture, secure leads to the die, and assist in securing the die to the substrate. In certain devices, it is known to provide mold locks on a surface of the substrate. The mold locks are intended to aid in securing encapsulant to the substrate.

Known mold locks can be in the form of a dimple on a surface of a substrate and also as a "v"-shaped groove or notch formed into the surface of the substrate. The dimple can be formed by, for example, etching or deposition as known in the art. Similarly, the v-shaped groove can be formed by etching, cutting, or otherwise notching a surface of the substrate. An encapsulant surrounds the dimple or fills the v-shaped groove.

BRIEF SUMMARY

The inventors have realized that in certain devices, such as those utilizing a heat spreader as the substrate, delamination is more likely to occur between an encapsulant, e.g. a mold compound, and heat spreader. Because of repetitive temperature cycling of those semiconductor devices utilizing a heat spreader, the mold compound or encapsulant material can degrade over time, and delaminate from the heat spreader. This weakness is particularly evident at the mold compound-heat spreader interface. Even further, it is a discovery herein that delamination forces typically occur in both an "x" direction and in a "y" direction relative to a heat spreader surface.

As indicated, the known solutions to delamination are confined to forming dimples and v-shaped notches in a surface of the heat spreader prior to introducing encapsulant to form a package. With those devices having only a small dimple formed on a surface of the heat spreader, very little lateral resistance will occur at the interface between the mold compound and the heat spreader. The mold compound and heat spreader can therefore be subject to sheer forces in the x-direction. In the presence of even limited sheer forces, delamination of the mold compound from the heat spreader can occur. Similarly, in the presence of lifting forces in the "y"-direction, there is no hold on the mold compound other than that provided by the die itself. If the die has also become detached due to a weak or impaired bond at the die bonding material, the mold compound, and hence die components, can delaminate from the heat spreader in a vertical, or "y"-direction. Because these known designs do not appreciate, recognize, or address delamination in both "x" and "y" directions, these designs have not reliably prevented delamination between the encapsulant and the heat spreader.

Accordingly, there continues to be a need for an improved mold lock which avoids delamination of mold compound from the heat spreader. Such mold locks would provide increased resistance to sheering and lifting forces, providing a more secure bond between the mold compound and heat spreader in both the "x" and "y" directions relative to the heat spreader or similar substrate. In addition, exemplary embodiments herein recognize that if an encapsulant delamination can be prevented, and even if a die attach material degrades, the encapsulant can continue to secure the die and the die attach material against the heat spreader, thereby ensuring a thermal path and device reliability throughout the life of the device.

The inventors have discovered an inventive mold lock that can be formed directly from the material of the substrate, such as a heat spreader. A mold lock can be formed by punching the substrate with a punch tool such that a neck portion extends a distance above a surface of the substrate. A distal end of the punched out neck is shaped to form a "head" having an orientation different from that of the neck. For example, the head can be shaped, e.g. "riveted", to be substantially parallel to the substrate, using a rivet forming tool. The head can be shaped as a "v" by splitting the distal end of the punched out neck, with yet a different type of tool. In each instance, the integral neck and head act as a lock for a mold composition surrounding the structure.

The present mold lock advantageously overcomes the persistent delamination found in the art in IC packages containing a heat spreader. For example, the neck of the mold lock prevents the sheering or "x"-direction delamination. Further, the shaped head of the mold lock advantageously controls lifting or "y"-direction delamination of the mold compound from the heat spreader. The mold lock can further be conveniently formed directly from the heat spreader and prevent delamination of the mold compound therefrom, even during repeated heat cycles of a packaged IC device.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
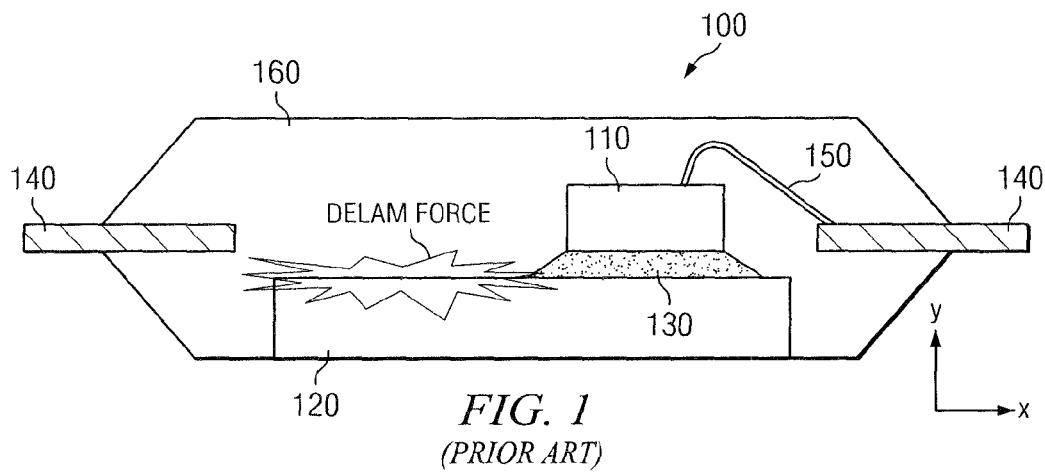
FIG. 1 depicts directional delamination forces occurring in an encapsulated semiconductor device.

FIG. 1 is presented to depict a known delamination event. Delamination forces occur in both an "x" direction and in a "y" direction as shown.

In the device of FIG. 1, a portion of a semiconductor device 100 is depicted. The device 100 includes a die 110 mounted on a heat spreader 120. As known in the art, the die 110 is attached to the heat spreader 120 via a known die attach material 130. The die 110 is typically electrically connected to a lead 140 by a connector 150. An encapsulant 160 encapsulates the semiconductor device 100. Stress placed on the connector 150 because of delamination of the encapsulant 160 from the heat spreader 120 causes the connector 150 to lift or break, thus causing device failures. More specifically, adhesion strength of the encapsulant material is less than adhesion strength of the die attach material. Because of this difference in adhesion strength, an encapsulant will delaminate from its substrate before that of the die attach material. When the encapsulant delaminates prior to the die attach material, the freed encapsulant will push against and break the connector 150. In addition, it has been found that a die attach material will degrade over time due to repetitive temperature cycling of the semiconductor device. It will appreciated that delamination of the die attach material will cause a loss of heat conduction away from the die, and eventually cause failure of the device due to the loss of thermal control. While the delamination of the encapsulant can be a relatively quick phenomena, thermal failure of the die attach material can be a longer term event. Device failure modes therefore occur in two areas, that of connector breakage and loss of a thermal path between the die and substrate via the die attach material. Device failure in at least these two respects can directly result from delamination of encapsulant.

Figure 2A:
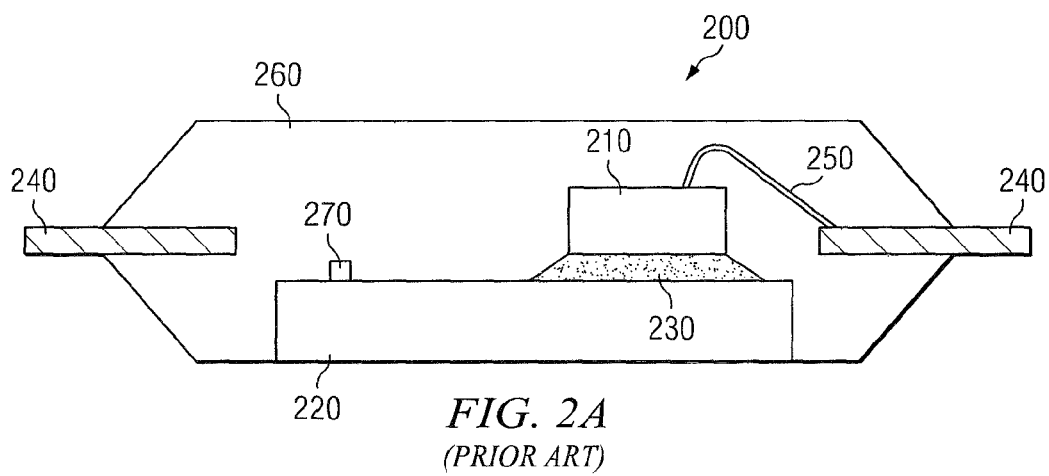
FIG. 2A depicts a dimple configuration known in the art for addressing delamination of a mold compound from a heat spreader.
Figure 2B:
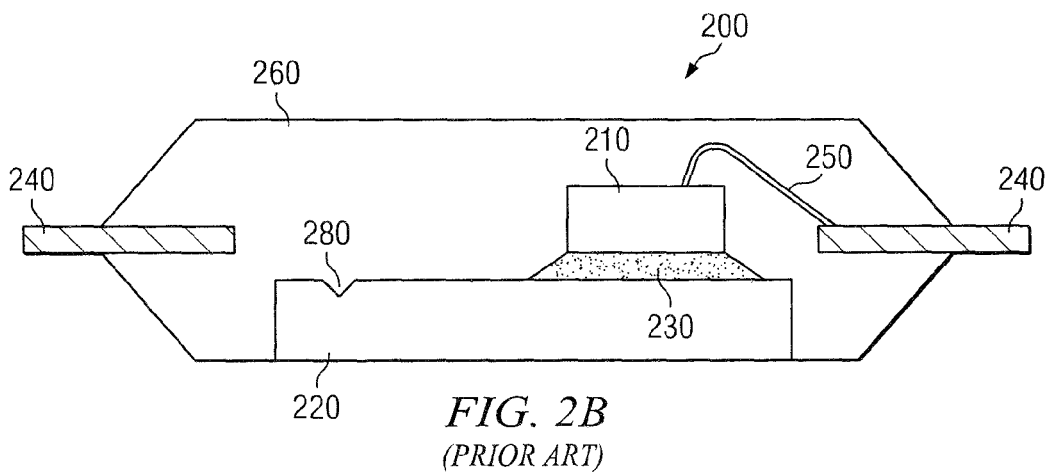
FIG. 2B depicts a V-shaped groove configuration known in the art for addressing delamination of a mold compound from a heat spreader.

Attempts to resist delamination of an encapsulant from a substrate of a semiconductor device have been attempted and are depicted in FIGS. 2A and 2B. Each device 200 of FIGS. 2A and 2B includes a die 210 mounted on a heat spreader 220. The die 210 is attached to the heat spreader 220 via a known die attach material 230. The die 210 is electrically connected to a lead 240 by a connector 250, such as a wire connector. An encapsulant 260 encapsulates the device 200. In FIG. 2A, a dimple 270 is formed on the heat spreader 220. The dimple 270 can be formed by etching, patterning, as known in the art. In FIG. 2B a v-shaped groove 280 is formed in the heat spreader 220. The encapsulant 260 surrounds the dimple 270 or fills the v-shaped groove 280. Although somewhat resistant to sheering, these efforts have enjoyed limited success. Specifically, these designs have not reliably prevented delamination between the encapsulant 260 and the heat spreader 220. The delamination may occur, regardless of the improvements, because delamination of encapsulant 260 can occur in both the "x" and "y" directions relative to the heat spreader 220 shown. Likewise, device reliability has not been improved; because of delamination of the encapsulant from the heat spreader as well as eventual delamination of the die attach material from the heat spreader, as described above.

Accordingly, there continues to be a need for an improved mold lock which avoids delamination of mold compound from the heat spreader. Such mold locks would provide increased resistance to sheering and separating forces, providing a more secure bond between the mold compound and heat spreader in both the "x" and "y" directions relative to the heat spreader or similar substrate. In addition, exemplary embodiments herein recognize that if an encapsulant delamination can be prevented, and even if the die attach material degrades, the encapsulant can continue to secure the die and the die attach material against the heat spreader, thereby ensuring a thermal path and device reliability throughout the life of the device.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 3:
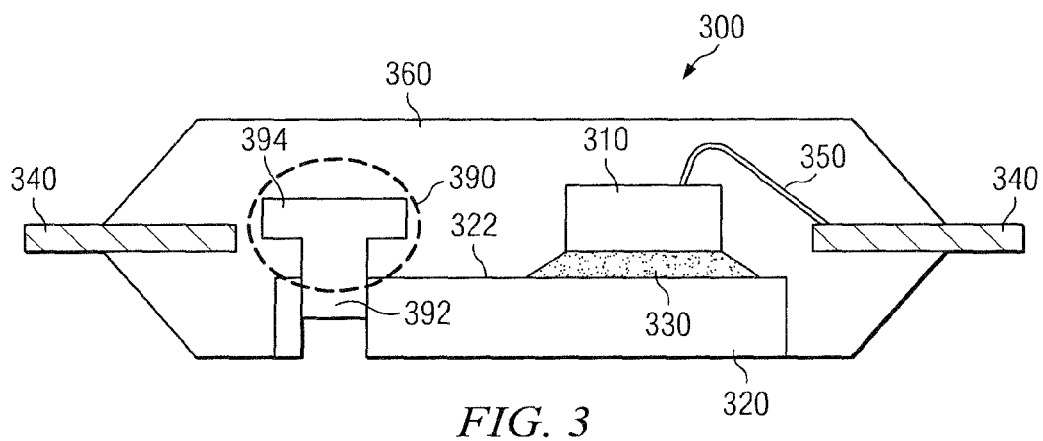
FIG. 3 is a diagram illustrating an exemplary mold lock according to certain embodiments.

According to embodiments, FIG. 3 is a side view depicting an exemplary mold lock 390 incorporated in a semiconductor device 300. It should be readily apparent to those skilled in the art that FIG. 3 is exemplary and that other elements can be added, removed or modified without departing from the scope of the exemplary embodiments.

As depicted, the mold lock 390 can be incorporated into the semiconductor device 300. While FIG. 3 depicts several components of the semiconductor device 300, one skilled in the art will realize that device 300 can include any number and type of components. The semiconductor device 300 can include a substrate 320, a die 310 connected to the substrate 320 by a die attach material 330, leads 340, a connector 350 electrically connecting the die 310 to the lead 340, the mold lock 390, and an encapsulant 360 encapsulating all but a portion of the leads 340. The encapsulant 360 can include any type of encapsulant material which can surround and encapsulate components prior to hardening, such as a form of hard-curing plastic or epoxy resin. The encapsulant 360 can be hardened by processes known in the art. By way of non-limiting examples, the encapsulant can be hardened by UV curing, heating, and air drying, as known in the art.

The substrate 320 can be formed of a material, using any process, to any dimension and specification, as known in the art. For example, the substrate can be a heated substrate such as a heat spreader 320. The heat spreader 320 can be an exposed pad, a thick heat spreader or heat plate as known in the art. In addition, each of the die 310, die attach material 330, leads 340, and connector 350 can formed of a material, using any process, to any dimension and specification, as known in the art, and details of these components need not be described further herein.

The mold lock 390 can include a neck portion 392 and a shaped head portion 394 at an end of the neck portion 392. The mold lock 390 can be formed from the heat spreader 320. More specifically, the neck portion 392 of the mold lock 390 can be extruded, from the heat spreader 320. Extrusion of the neck portion 392 can be by a punch tool. Extrusion of the neck portion 392 can be such that a predetermined portion of the neck extends from a surface 322 of the heat spreader 320. For example, about half of the height of the neck portion 392 can extend from the surface 322 of the head spreader 320 and a remaining height of the neck portion 392 can remain within the heat spreader 320. It will be appreciated that a height of the neck portion 392 extending above the surface 322 of the heat spreader 320 can be adjusted according to parameters of the neck portion 392, e.g. a circumference, diameter, density, strength, etc. of the neck portion.

An exposed end of the neck portion 392 can be further tooled to define a shaped head 394. The shaped head 394 can be shaped according to use of a tool used to form the shaped head 394. For example, the shaped head can have a lateral dimension greater than a lateral dimension of the neck portion 392. For example, the shaped head can be a rivet shaped head 394. As such, the rivet shaped head 394 can be integral with the neck portion 392 of the mold lock 390. Even further, the rivet shaped head 394 and neck portion 392 can be of a one-piece construction. The mold lock 390 can have a resulting T-shape, or Y-shape when viewed from the side, or a "disc" shape from a top view, with the shaped head 394 spaced a distance from the surface 322 of the heat spreader 320. However, although the shaped head 394 is shown to have a right angle relative to the neck portion 392, the head portion 394 can be substantially perpendicular to the neck portion 392 or at some angle relative to the neck portion 392 which will prevent lifting of the encapsulant 360 in a vertical direction from the head spreader 320.

It will be appreciated that the encapsulant 360 surrounds the mold lock 390, and that the mold lock 390 can prevent lifting, separation, or delamination of the encapsulant 360 from the heat spreader 320. Further, the shape of the mold lock 390 can prevent delamination of the mold compound 360 from the heat spreader 320 caused by forces in multiple directions, for example, in either of an "x" or a "y" direction relative to the heat spreader 320.

Figure 4:
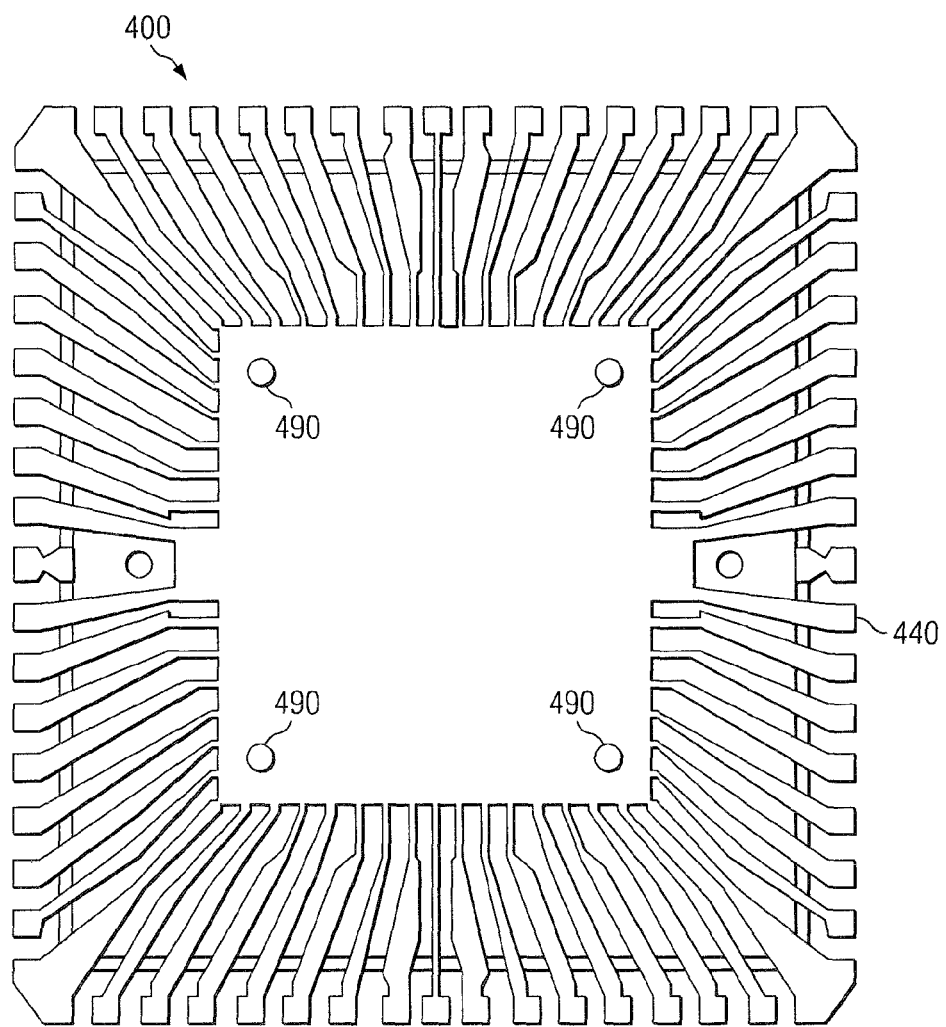
FIG. 4 is a diagram illustrating positioning of exemplary mold locks according to certain embodiments.

FIG. 4 illustrates a positioning of mold locks 490 in a semiconductor device 400. It should be readily apparent to those skilled in the art that FIG. 4 is exemplary and that other elements can be added, removed or modified without departing from the scope of the exemplary embodiments.

In FIG. 4, an exemplary mold lock 490 can be positioned at multiple locations of the semiconductor device 400. For example, a mold lock 490 can be positioned at each of four corners of the semiconductor device 400 and particularly adjacent an end of a lead 440 as depicted. By positioning the mold locks 490 at point locations of the semiconductor device 400, the mold locks 490 can globally prevent delamination of the mold compound (not shown) from the heat spreader (not shown) without taking over substantial and valuable real estate of the semiconductor device. Further, the mold locks 490 can be specifically positioned at high stress locations of the semiconductor device 400. At the same time, the positioning of the mold locks 490 can comprise alignment marks for wire bonding and mounting processes. The spaced positioning of the mold locks 490 can further be provided independently of a bond pad, thereby avoiding problems associated with using a bond pad as a mold lock. Accordingly, with multiple mold locks 490 positioned as shown, delamination can be prevented globally across the semiconductor device. While FIG. 4 illustrates mold lock 490 positioned in several exemplary locations, one skilled in the art will realize that mold lock 490 can be positioned in any number of locations as required by the semiconductor device 400.

Figure 5A:
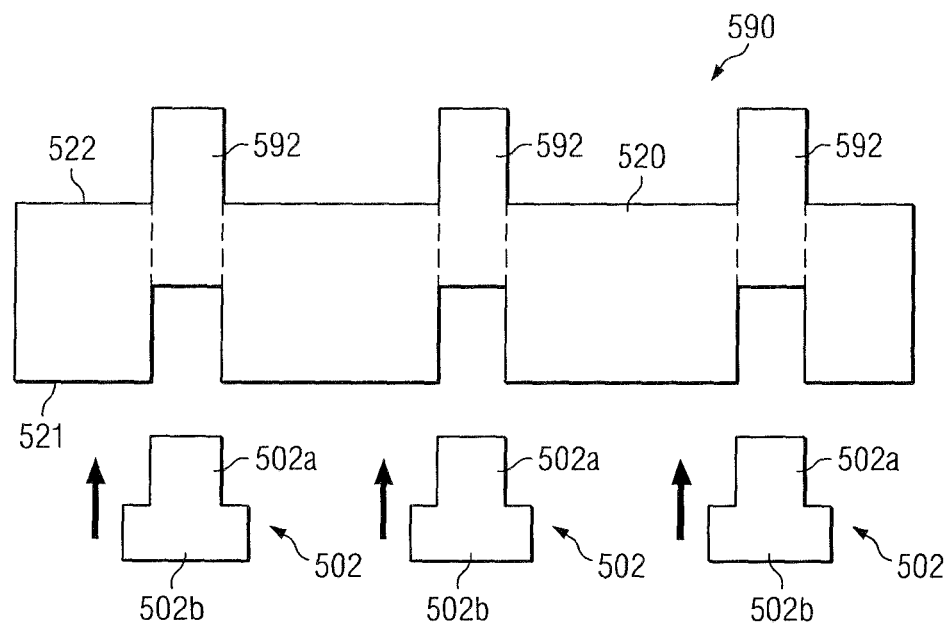
FIG. 5A is a diagram illustrating a step of forming exemplary mold locks according to certain embodiments.
Figure 5B:
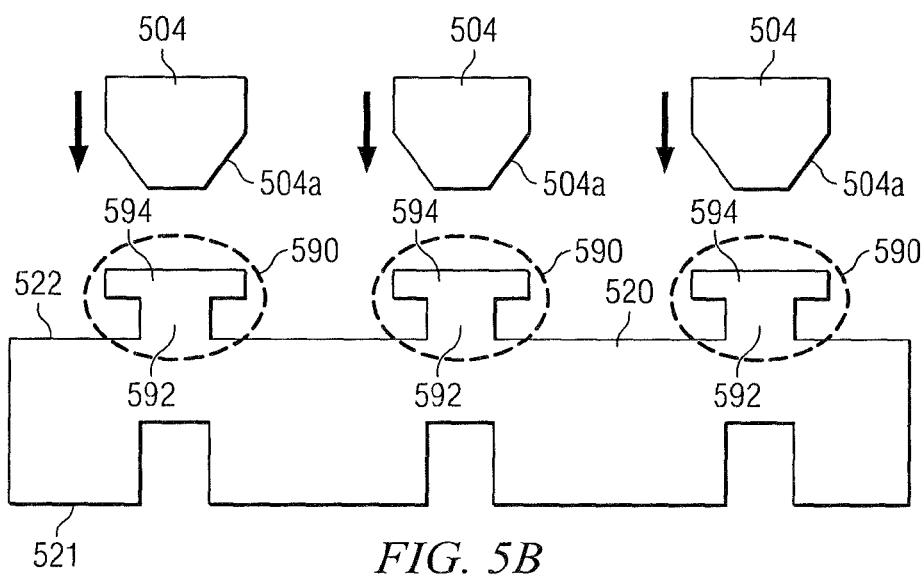
FIG. 5B is a diagram illustrating another step of forming exemplary mold locks according to certain embodiments.
Figure 5C:
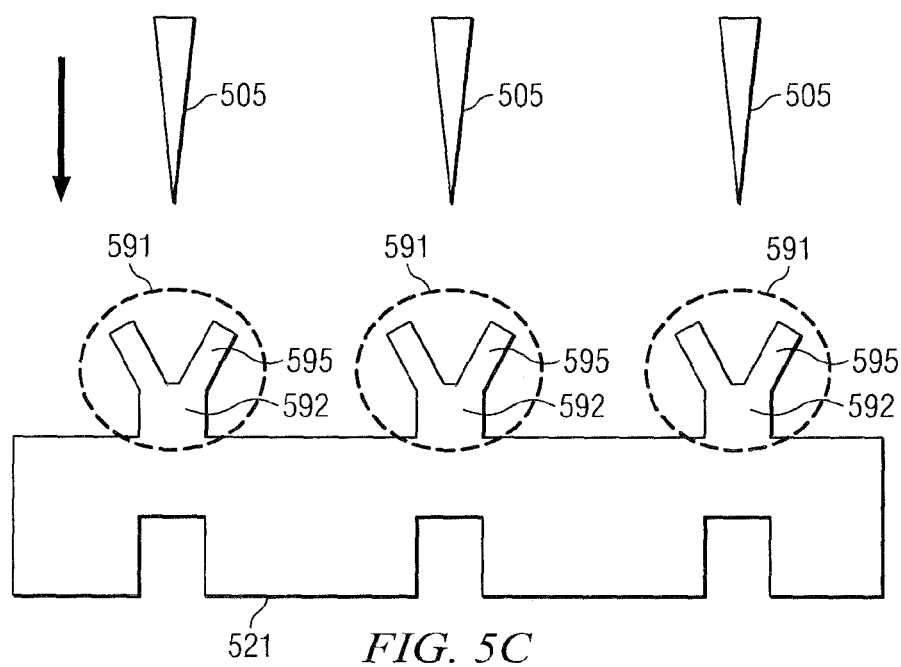
FIG. 5C is a diagram illustrating another step of forming exemplary mold locks according to certain embodiments.

FIGS. 5A, 5B, and 5C illustrate an exemplary formation of a mold lock 590 and 591 utilizing exemplary methods. FIGS. 5A, 5B, and 5C further depict multiple mold locks 590 and 591 formed from a single substrate, however, it will be appreciated that more or less mold locks can be formed at one time utilizing the same exemplary formation. It should be readily apparent to those skilled in the art that FIGS. 5A, 5B, and 5C are exemplary and that other steps can be added, and existing steps can be removed or modified without departing from the scope of the exemplary embodiments.

FIG. 5A depicts an exemplary heat spreader 520 and an operationally positioned punch tool 502. The punch tool 502 can reciprocate linearly along a path needed to impart a "punch through" of the heat spreader 520. The punch tool 502 can include plural punch tools as shown, acting either individually or in unison. Impact can be in a direction of the arrows, whereas retraction of the punch tool 502 can be in a linear direction opposite that of the arrows. Impact of the punch tool 502 on the heat spreader 520 can define a neck of a mold lock 590 formed directly from the heat spreader 520. An ejected portion of the neck is labeled 592. The neck 592 protrudes from an opposite side of the heat spreader 520 as that of the punch tool 502, leaving an indentation on the back side 521 of the heat spreader 520. The neck 592 can protrude a distance above a front support surface 522 of the heat spreader 520. The neck 592 can have a defined height above surface 522. That portion of the neck 592 remaining in the heat spreader 520 can be referred to as the base of the neck 592.

The height and shape of neck 592 can be directly controlled by a dimension of the punch tool 502. For example, the punch tool 502 can include a tool shaft 502a of a predetermined length and a tool head 502b which is struck in order to knock the shaft 502a of the punch tool 502 into the back side 521 of the heat spreader 520. The tool head 502b further limits the depth of the tool shaft 502a by its abutment against the back side 521 of the heat spreader 520. Further, a dimension of the neck 592 can take the shape of the punch tool 502. The shape of the punch tool 502 can be, for example, circular, thus defining and ejecting a tubular neck 592. The punch tool 502 can be part of a holder (not shown), the holder operable to reciprocate the punch too. Alternatively, the punch tool 502 can operably eject from a stationary holder (not shown), the punch tool operable independently of the housing.

FIG. 5B depicts the heat spreader 520 having a mold lock 590 with a "T-shaped" head 594 whereas FIG. 5C depicts the heat spreader 520 having a mold lock 591 with a "Y-shaped" head 595. Each mold lock head can be formed from the same ejected mold lock neck 592 initiated at FIG. 5A, and will be described separately in the following.

FIG. 5B depicts the heat spreader 520 and an operationally positioned riveting tool 504. The riveting tool 504 can linearly reciprocate along a path needed to form a rivet head 594 of mold lock 590 at a distal end of the neck 592. The riveting tool 504 can include plural riveting tools as shown, acting either individually or in unison. Impact by the riveting tool 504 can be in a direction of the arrows, whereas retraction of the riveting tool 504 can be in a linear direction opposite that of the arrows. The riveting tool 504 can be of a shape to form a rivet at the distal end of the neck 592. For example, the riveting tool 504 can include a work end 504a, the work end 504a tapered to curl or flatten the distal end of the neck into the desired shaped rivet head 594. A force applied to the distal end of the neck can also be used to control a size and shape of the rivet head 594. For example, a greater force by the riveting tool 504 against the neck 592 can form a larger diameter rivet head 594, and a lesser force can form a relatively smaller diameter rivet head 594.

The resulting mold lock 590 is depicted in FIG. 5B. More specifically, the mold lock 590 can include the neck 592 and head 594, the head 594 being positioned substantially perpendicular to the neck 592 and of a greater lateral dimension than the neck. With a circular shaped neck 592 and rivet head 594, the rivet head can be of a greater diameter than a diameter of the neck 592. The shaped rivet head 594 can be formed to be spaced a distance from the surface 522 of the heat spreader 520. The rivet tool 504 can be controlled manually, electronically, or otherwise, in order to provide a resulting shaped rivet head 594 relative to the neck 592. In certain embodiments, the neck portion of the mold lock 590 can be about 0.4 mm in diameter. In certain embodiments, the head portion of the mold lock 590 can be about 0.6 mm in diameter. It will be appreciated, however, that these dimensions are exemplary only and can change according to punch tool and rivet tool specifications and force applied for each, with the diameter of the head being larger than a diameter of the neck.

In certain embodiments, the punch tool 502 can comprise a single punch tool or a set of punch tools. With a set of punch tools, either manual or automatic operation of the punch tool can individually or simultaneously perform a punch operation on the heat spreader 520. Likewise, in certain embodiments, the rivet tool 504 can comprise a single rivet tool or a set of rivet tools. With a set of rivet tools, either manual or automatic operation of the rivet tool 504 can individually or simultaneously perform a rivet forming operation on the head 594 of the neck 592.

FIG. 5C depicts the heat spreader 520 and an operationally positioned head forming tool 505. The head forming tool 505 can linearly reciprocate along a path needed to form a Y-shaped head 595 of mold lock 591 at a distal end of the neck 592. The head forming tool 505 can include plural head forming tools as shown, acting either individually or in unison. Impact by the head forming tool 505 can be in a direction of the arrows, whereas retraction of the head forming tool 505 can be in a linear direction opposite that of the arrows. The head forming tool 505 can be of a shape to form a "Y" at the distal end of the neck 592. For example, the head forming tool 505 can include a conical shape to correspondingly shape the distal end of the neck into the desired head shape 595. A force applied to the distal end of the neck by the head forming tool 505 can also be used to control a size and shape of the head 595. For example, a greater force by the tool 505 against the neck 592 can form a larger diameter head 595, and a lesser force can form a relatively smaller diameter head 595.

The resulting mold lock 591 is depicted in FIG. 5C. More specifically, the mold lock 591 can include the neck 592 and head 595, the head 595 having an outer surface formed at an obtuse angle relative to the neck 592, having an acute internal angle, and of a greater lateral dimension than the neck 592. With a circular shaped neck 592 and head 595 (as viewed from a top view, not shown), the head 595 can be of a greater diameter than a diameter of the neck 592. The head 595 can be formed to be spaced a distance from the surface 522 of the heat spreader 520. The head forming tool 505 can be controlled manually, electronically, or otherwise, in order to provide a resulting shaped head 595 relative to the neck 592. In certain embodiments, the neck portion 592 of the mold lock 591 can be about 0.4 mm in diameter. In certain embodiments, the head portion 595 of the mold lock 591 can be about 0.6 mm in diameter. It will be appreciated, however, that these dimensions are exemplary only and can change according to punch tool and head shaping tool specifications and force applied for each, with the diameter of the head being larger than a diameter of the neck.

In certain embodiments, the punch tool 502 can comprise a single punch tool or a set of punch tools. With a set of punch tools, either manual or automatic operation of the punch tool can individually or simultaneously perform a punch operation on the heat spreader 520. Likewise, in certain embodiments, the rivet tool 504 and the head forming tool 505 can comprise a single tool or a set of tools. With a set of head forming tools, either manual or automatic operation of the tool 504, 505 can individually or simultaneously perform a rivet forming operation or head shaping operation on the distal end of the neck 592.

Either depicted mold lock 590 in FIG. 5B or 591 in FIG. 5C protruding from the surface 522 of the heat spreader 520 can be incorporated into a semiconductor device as known in the art. The encapsulant can surround the mold lock 590 or 591 and secure the encapsulant material and a die attach material of the die to the heat spreader 520 such that the encapsulant and die attach material are prevented from delaminating from the heat spreader 520.

It will be appreciated that while the mold lock 590 or 591 is disclosed and described in connection with a heat spreader, that exemplary embodiments are well suited to other semiconductor device support surfaces. Accordingly, depiction and description of a heat spreader is not intended to limit the scope of exemplary embodiments.

Figure 6A:
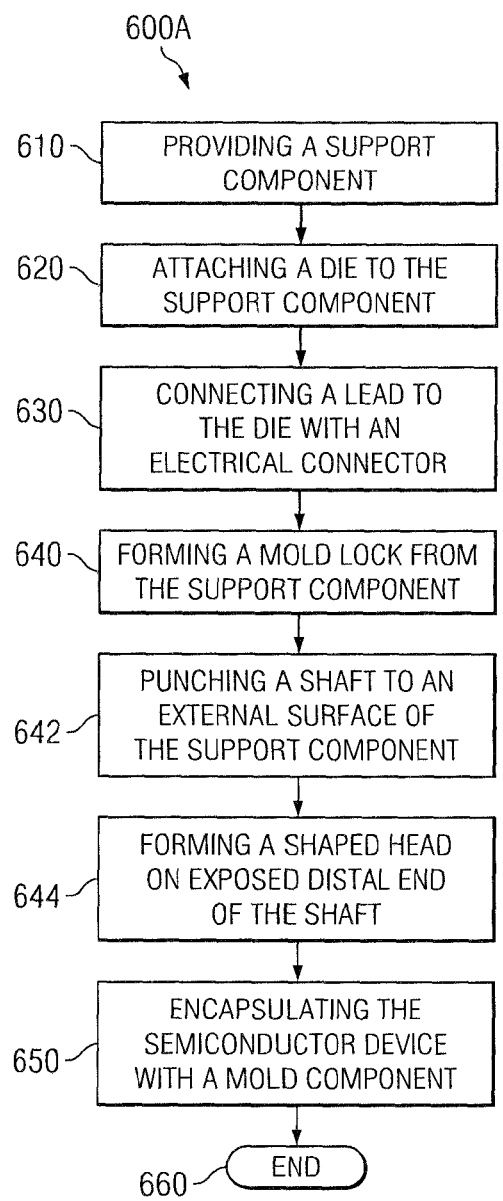
FIG. 6A is a flow diagram depicting an exemplary method of forming a mold lock according to certain embodiments.
Figure 6B:
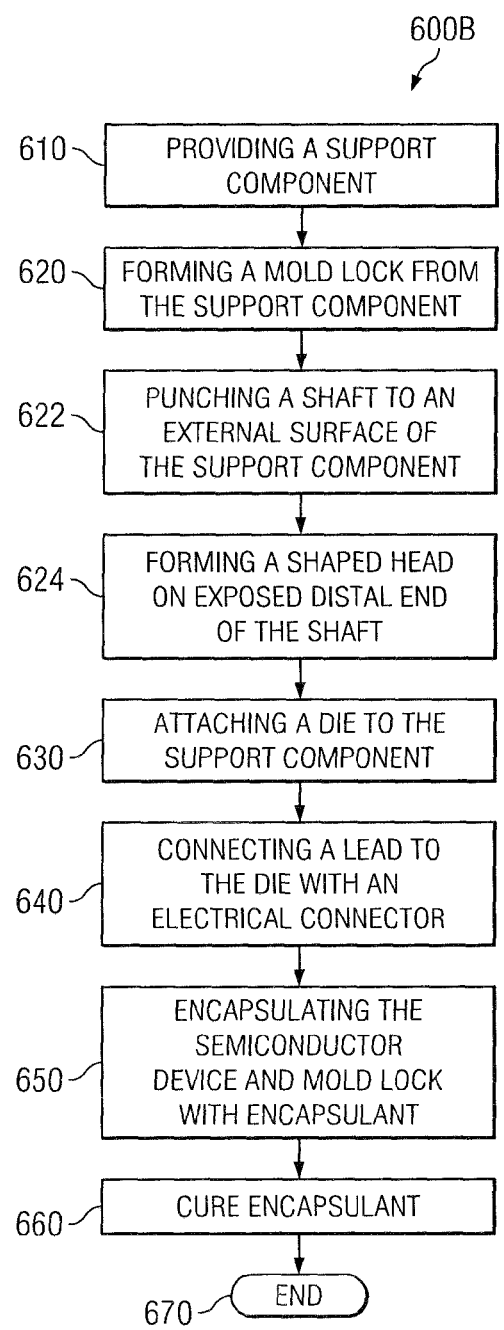
FIG. 6B is a flow diagram depicting an exemplary method of forming a mold lock according to certain embodiments.

Methods of FIGS. 6A and 6B illustrate exemplary methods of forming a mold lock in a semiconductor device. From the methods, it will be appreciated that the forming of the mold lock can be at various stages of manufacture, but before an encapsulant is applied to the device. For example, forming the mold lock can be a at lead frame supplier site, or at any other location common to or apart from forming a remainder of the semiconductor device. Accordingly, FIGS. 6A and 6B are exemplary steps; however the order of steps can be varied to the extent that the encapsulant is applied after forming the mold lock.

FIG. 6A is a flow diagram illustrating a method 600A of forming a mold lock in a semiconductor device, consistent with embodiments of the present disclosure. It should be readily apparent to those skilled in the art that FIG. 6A is exemplary and that other steps can be added or existing steps can be removed or modified without departing from the scope of the exemplary embodiments.

Method 600A begins at 610 with providing a support component, the support component comprising a support surface and a back side. The support component can comprise a heat spreader, and further comprise a thick heat spreader.

In 620, the method can include attaching a die to the support component. The die can include a die as known in the art. In 630, the method can include connecting a lead to the die with an electrical connector, as also known in the art.

In 640, the method can include forming a mold lock from the support component. Forming the mold lock from the support component can include, at 642, the subset step of punching a neck from a semiconductor device support component to an external surface of the support component. In punching the neck through the support component, a portion of the neck remains seated in the support component. More specifically, punching the support component to form the neck comprises using a punch tool of a predetermined dimension and punch depth. In 644, the method can include the step of forming a shaped head on an exposed distal end of the punched out neck. In embodiments, forming the shaped head on the punched out neck comprises using a shaping tool to deform the exposed distal end of the neck into a desired shaped head. In embodiments, the shaped head is substantially perpendicular to the neck. In embodiments, the shaped head is at an obtuse angle to the neck, or at an angle to prevent lifting of a mold compound from the surface of the support component.

In 650, the method can include encapsulating the semiconductor device with a mold compound. In 660, the method can end, but the method can return to any point and repeat.

FIG. 6B is a flow diagram illustrating a method 600B of forming a mold lock in a semiconductor device, consistent with embodiments of the present disclosure. It should be readily apparent to those skilled in the art that FIG. 6B is exemplary and that other steps can be added or existing steps can be removed or modified without departing from the scope of the exemplary embodiments.

Method 600B begins at 610 with providing a support component, the support component comprising a support surface. The support component can comprise a heat spreader, and further comprise a thick heat spreader.

In 620, the method can include forming a mold lock from the support component. Forming the mold lock from the support component can include, at 622, the subset step of punching a neck from a semiconductor device support component to an external surface of the support component. In punching the neck through the support component, a portion of the neck remains seated in the support component. More specifically, punching the support component to form the neck comprises using a punch tool of a predetermined dimension and punch depth. In 624, the method can include the step of forming a shaped head on an exposed distal end of the punched out neck. In embodiments, forming the shaped head on the punched out neck comprises using a shaping tool to deform the exposed distal end of the neck into a desired shaped head. In embodiments, the shaped head is substantially perpendicular to the neck. In embodiments, the shaped head is at an obtuse angle to the neck, or at an angle to prevent lifting of a mold compound from the surface of the support component.

In 630, the method can include attaching a die to the support component. The die can include a die as known in the art. In 640, the method can include connecting a lead to the die with an electrical connector, as also known in the art.

In 650, the method can include encapsulating the semiconductor device with a mold component. In 660, the method can end, but the method can return to any point and repeat.

Thus, the exemplary embodiments provide mold locks, IC packages and methods used in their construction, providing secure mechanical bonds resistant to separation and sheer. Numerous technical advantages are provided by the exemplary embodiments, including but not limited to improved package strength, resilience, longevity, manufacturability, and reliability. A further advantage is that the mold lock can provide a significant and distinguishable alignment mark for the wire bonder, and mount process.

While the invention has been described with reference to the exemplary embodiments thereof those skilled in the art will be able to make various modifications to the described embodiments without departing from the true spirit and scope. The terms and descriptions used herein are set forth by way of illustration and are not meant as limitations. In particular, although the method has been described by examples, the steps of the method may be performed in a different order than illustrated or simultaneously. Furthermore, to the extent that the terms "including", "includes", "having", "has", "with", or variants thereof are used in either the detailed description and the claims, such terms are intended to be inclusive in a manner similar to the term "comprising". As used herein, the term "one or more of" with respect to a listing of items such as, for example, A and B, means A alone, B alone, or A and B.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An encapsulated semiconductor device comprising:
 a support component of the semiconductor device, the support component comprising an upper surface and a lower surface;
 a die mounted on the upper surface of the support component;
 a mold lock comprising a circular-shaped head and a cylindrical neck supporting the circular-shaped head, which has a diameter greater than the cylindrical neck, the mold lock comprising at least a portion of the support component, and the circular-shaped head integral with the cylindrical neck of the mold lock.

2. The device of claim 1, the neck comprising a base portion seated within the support component.

3. The device of claim 1, wherein the circular-shaped head comprises a riveted head substantially perpendicular to the neck.

4. The device of claim 1, wherein the mold lock substantially comprises a T-shape cross section.

5. The device of claim 1, wherein an outer surface of the circular-shaped head is at an obtuse angle to the neck.

6. The device of claim 1, wherein the mold lock substantially comprises a V-shape cross section.

7. The device of claim 1, wherein the support component comprises a heat spreader.

8. A semiconductor device comprising:
 a support component having a support surface;
 a die attached to the support surface;
 a lead connected to the die by an electrical connector;
 a mold lock provided on the support component, the mold lock comprising:
  a circular-shaped head and a cylindrical neck supporting the circular-shaped head, which has a diameter greater than the cylindrical neck, the mold lock comprising at least a portion of the support component, and the circular-shaped head integral with the cylindrical neck of the mold lock; and a mold compound encapsulating the semiconductor device, wherein the mold lock prevents delamination of the mold compound from the support component.

9. The device of claim 8, the neck comprising a base portion seated within the support component.

10. The device of claim 8, wherein the circular-shaped head comprises a riveted head substantially perpendicular to the neck.

11. The device of claim 8, wherein the circular-shaped head is at an obtuse angle to the neck.

12. The device of claim 8, wherein the support component comprises a heat spreader.

13. The device of claim 8, wherein the semiconductor device comprises plural mold locks.

14. The device of claim 13, wherein the plural mold locks are positioned adjacent to outer edges of the support component.

15. A method of forming a semiconductor device comprising:
    forming a mold lock on a support surface of a support component, forming the mold lock comprising:
        punching from a back side of the support component to extrude a cylindrical neck portion from a support surface of the support component and form an indentation in the back side of the support component; and
        shaping a distal end of the neck portion to form an integral circular-shaped head with a diameter greater than that of the cylindrical neck, on the neck portion; and
    encapsulating the semiconductor device, the mold lock securing the encapsulant to the support surface of the support component.

16. The method of claim 15, wherein punching comprises using a punch tool of a predetermined dimension and punch depth.

17. The method of claim 15, wherein shaping the head comprises using a riveting tool to deform the exposed distal end of the cylindrical neck into a rivet circular-shaped head substantially perpendicular to the neck.

18. The method of claim 15, wherein shaping the head comprises using a conically shaped tool to deform the exposed distal end of the neck into a head with a V-shaped cross section.

19. The method of claim 15, wherein the support component comprises a heat spreader.

20. A method of forming a semiconductor device comprising:
    mounting a die on a support component, the support component comprising a cylindrical neck and a circular-shaped head with a diameter greater than that of the cylindrical neck on a die mounting surface and an indentation on a back surface, the neck and head protruding by an amount substantially corresponding to a depth of the indentation on the back surface; and
    encapsulating the semiconductor device, the neck and head preventing
    delamination of the encapsulant from the support surface of the support component in either of a lateral and vertical directions relative to the support surface.

* * * * *